United States Patent [19]
Onoda et al.

[11] Patent Number: 5,886,874
[45] Date of Patent: Mar. 23, 1999

[54] IC CARD

[75] Inventors: Shigeo Onoda; Katsunori Ochi; Yasuhiro Murasawa; Tetsuro Washida, all of Tokyo, Japan

[73] Assignee: Mitsubishi Denki Kabushiki Kaisha, Tokyo, Japan

[21] Appl. No.: 634,930

[22] Filed: Apr. 19, 1996

[30] Foreign Application Priority Data

Nov. 2, 1995 [JP] Japan .................................. 7-285843

[51] Int. Cl.$^6$ ...................................................... H05K 1/14
[52] U.S. Cl. .......................... 361/737; 361/735; 361/736; 361/748; 361/752; 361/784; 361/790; 361/796; 361/804; 235/487; 439/946
[58] Field of Search ..................... 361/735–737, 361/748, 752, 784, 790–791, 796, 803–804, 770, 772, 774; 235/487, 492; 439/946; 257/679, 723, 724, 686, 778

[56] References Cited

U.S. PATENT DOCUMENTS

| | | | |
|---|---|---|---|
| 5,210,442 | 5/1993 | Ishimoto | 257/679 |
| 5,299,094 | 3/1994 | Nishino et al. | 361/737 |
| 5,335,145 | 8/1994 | Kusui | 361/737 |
| 5,414,253 | 5/1995 | Baudouin et al. | 235/492 |
| 5,583,748 | 12/1996 | Gochi et al. | 361/737 |

FOREIGN PATENT DOCUMENTS

3280496  12/1991  Japan .

Primary Examiner—Leo P. Picard
Assistant Examiner—Phuong T. Vu

[57] ABSTRACT

IC card of the present invention consists of a frame including a rectangular bottom plate and a U-shaped side wall along the three edges of the bottom plate; a connector fixed to the open side of the frame with the U-shaped side wall; a board module at least one including printed-circuit boards with electronic components mounted thereon, combined with the connector, and inserted in the frame; and a metal panel for sealing off the board module inside the frame with the connector fixed thereto.

9 Claims, 10 Drawing Sheets

CONVENTIONAL ART

IC CARD

BACKGROUND OF THE INVENTION

1. Field of the Invention

The present invention generally relates to an IC card, more particularly to a thinner IC card which accommodates more electronic components more compactly.

2. Description of the Prior Art

IC cards based on PCMCIA specification have been now widely used.

Figure 14:
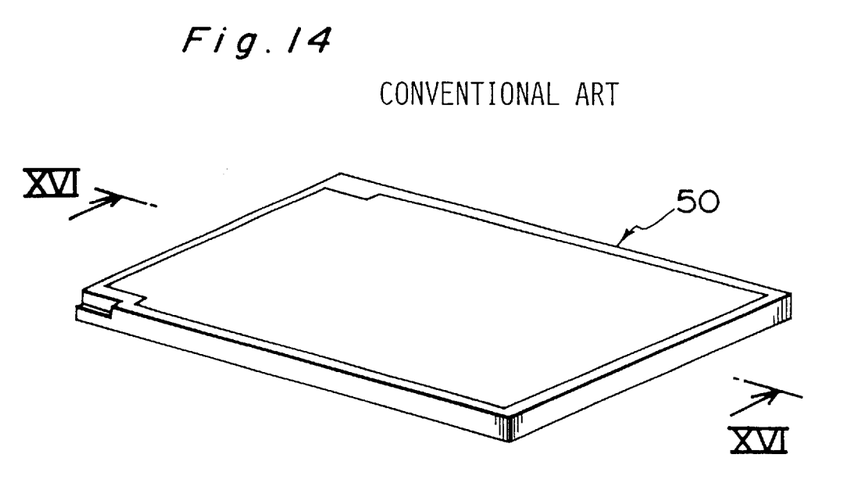
FIG. 14 is a perspective view showing the external appearance of a conventional IC card.
Figure 15:
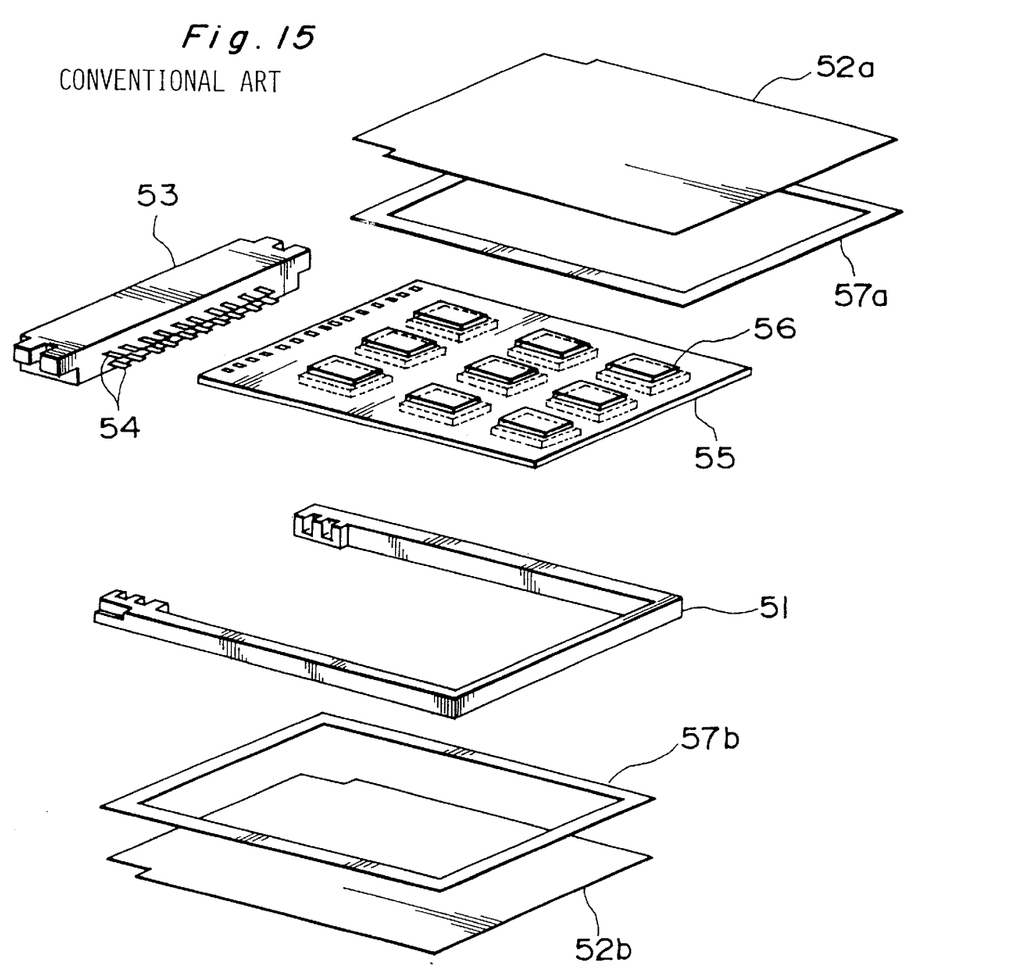
FIG. 15 is an exploded view of the IC card shown in FIG. 14.
Figure 16:
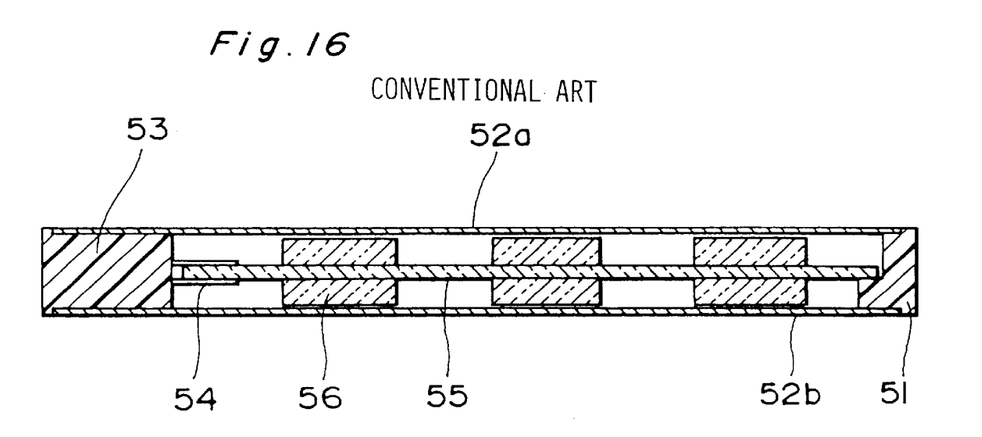
FIG. 16 is a cross section of the IC card shown in FIG. 14 cut along the plane XVI—XVI.

FIG. 14 is a perspective view showing an external appearance of a conventional IC card. FIG. 15 is an exploded view of the IC card shown in FIG. 14. FIG. 16 is a cross section of the IC card shown in FIG. 14 cut along the plane XVI—XVI.

In FIGS. 14–16, an IC card 50 includes a U-shaped frame 51 made of plastic for example, metal panels 52a and 52b, a connector 53, made of plastic for example, which has a plurality of terminals 54 insert-molded therein so as to protrude inside of IC card 50, and a printed-circuit board 55 with electronic components 56 mounted on both surfaces thereof.

Inner tip ends of terminals 54 of connector 53 are formed so as to insert one side of board 55 along which a plurality of connecting tips are printed and, when inserted, electrically connect lines of board 55 with those of the external system, respectively. The combined connector 53 and printed-circuit board 55 are coupled with frame 51 so that the connector and the frame contain the printed-circuit board. Combined frame 51 and connector 53 containing printed-circuit board 55 connected to terminals 54 of the connector are sandwiched between metal panels 52a and 52b through adhesive sheets 57a and 57b, respectively.

Upon assembling an IC card as shown in FIGS. 14–16, printed-circuit board 55, with electronic components mounted on it, is connected to connector 53 by means of connector terminals 54, and then connector 53 is fit to frame 51. Then adhesive sheets 57a and 57b are pasted to metal panels 52a and 52b, respectively. Metal panels 52a and 52b are fixed, with heat and pressure, by means of adhesive sheets 57a and 57b, respectively, to frame 51 combined with connector 53 and printed-circuit board 55 from the top and the bottom. In the process of assembling IC cards adhesive sheets 57a and 57b must be pasted to metal panels 52a and 52b in considerable precision. Further, the amount of heat and pressure required to fix the metal panels to the frame must also be controlled precisely. Thus, manufacturing conventional IC cards requires the greatest attention in the assembly process, which results in higher manufacturing cost.

As increasingly more electronic components are mounted on a conventional IC card of a fixed size of 85.6 mm×54.0 mm×3.3 mm, for example, a multilayer printed-circuit board has been used to accommodate them. The structure of a multilayer printed-circuit board with electronic components mounted thereon and the mounting method are disclosed in Japanese Patent Laid-Open Publication HEI 3-280496. The structure disclosed in that publication includes stacked printed-circuit boards with common through holes in them and a plurality of electronic components which are inserted in each through hole and mounted on top of one another. Only "bonding" is allowed in this configuration, and an electronic component with a molded package cannot be mounted. Ordinary soldering such as reflow soldering cannot be used either. This structure does not allow printed-circuit boards to have electronic components initially mounted on them and then to be stacked on top of one another.

SUMMARY OF THE INVENTION

Therefore, one object of the present invention is to provide an IC card which accommodates more electronic components more compactly yet has a simpler structure thus giving rise to easier manufacturing at lower cost.

The present invention provides an IC card comprising a frame including a substantially rectangular bottom plate and a U-shaped side wall along the three edges of the bottom plate; a connector fixed to the open side of the frame with the U-shaped side wall; a board module including at least one printed-circuit board with electronic components mounted thereon, combined with the connector, and inserted in the frame; and a metal panel for sealing the board module inside the frame with the connector fixed thereto. While a conventional IC card uses two metal panels this invention requires only one metal panel because the bottom plate of the frame, formed in one piece with the frame, can substitute for the bottom panel of the conventional IC card. The connector, combined with the board module, is fixed to the open side of the frame with the U-shaped side wall. After the board module is fixed to the frame, the metal panel seals the board module inside the frame combined with the connector.

One embodiment of the present invention provides an IC card, wherein the board module comprises a first printed-circuit board with electronic components mounted thereon and a second printed-circuit board with electronic components mounted thereon, the second printed-circuit board being overlaid on top of the first printed-circuit board and connected therewith so that the mounting surfaces of the electronic components face in the same direction and the surface of second printed-circuit board with no electronic component mounted thereon faces the metal panel. The first and second printed-circuit boards, each having electronic components mounted on one surface, are overlaid on top of each other so that the surfaces with the electronic components mounted thereon face in the same direction. The board module is formed by electrically connecting the printed-circuit boards with each other. Then, the connector combined with the board module is fixed to the open side of the frame with the U-shaped side wall so that the surface of the board module with no electronic component mounted thereon faces the metal panel.

Another embodiment of the present invention provides an IC card, wherein the metal panel is formed with a metal foil. The connector, combined with the board module, is fixed to the open side of the frame with the U-shaped side wall so that the surface of the second printed-circuit board with no electronic component mounted thereon faces the metal panel. The metal foil is pasted on the surfaces of the second printed-circuit board with no electronic component mounted thereon, the connector, and the frame in order to seal the board module inside the frame combined with the connector.

A further embodiment of the present invention provides an IC card, wherein the second printed-circuit board includes through holes where the electronic components mounted on the first printed-circuit board are inserted so that when the first printed-circuit board is overlaid on the second printed-circuit board and brought into contact therewith, the electronic components mounted on the first printed-circuit board do not come into contact with the non-mounting surface of the second printed-circuit board. The board module is formed by bringing the first printed-circuit board into contact with the second printed-circuit board, with the first printed-circuit board overlaid on top of the second printed-circuit board so that the surfaces of both the printed-circuit boards with the electronic components mounted thereon face in the same direction. In this process each of the electronic components mounted on the first printed-circuit board is inserted into the corresponding through hole. Then, electrical and mechanical connections between the first and second printed-circuit boards are made.

A still further embodiment of the present invention provides an IC card, wherein the first and second printed-circuit boards include bonding pads on the facing surfaces thereof at opposite positions so that the first and second printed-circuit boards can be connected by soldering the bonding pads. The first printed-circuit board is brought into contact with the second printed-circuit board with the first printed-circuit board overlaid on top of the second printed-circuit board so that the surfaces of both the printed-circuit boards with the electronic components mounted thereon face in the same direction. The printed-circuit boards are electrically connected by soldering the bonding pads formed on both the printed-circuit boards.

A still further embodiment of the present invention provides an IC card, wherein the first and second printed-circuit boards include semicircular through holes at opposite positions along a side of said board module, so that the first and second printed-circuit boards can be connected by soldering each pair of corresponding semicircular through holes. The first printed-circuit board is brought into contact with the second printed-circuit board with the first printed-circuit board overlaid on top of the second printed-circuit board so that the surfaces of both the printed-circuit boards with the electronic components mounted thereon face in the same direction. The printed-circuit boards are electrically connected by soldering the semicircular through holes.

A still further embodiment of the present invention provides an IC card, wherein the first and second printed-circuit boards are formed from one single printed-circuit board, one surface of which forms connecting surfaces for the first and second printed-circuit boards, and the other surface of which includes a folding portion with a slit along the boundary of the first and second printed-circuit boards, the board module being formed by folding the single printed-circuit board along the folding portion so that the connecting surfaces of the first and second printed-circuit boards are in contact with each other. The first and second printed-circuit boards are first formed on a single common printed-circuit board having a slit cut halfway along the boundary of the first and second printed-circuit boards. The single board is then folded along the slit so that the connecting surface of the first printed-circuit board is brought into contact with the same connecting surface of the second printed-circuit board to form the board module after electrically connecting the printed-circuit boards with each other.

A still further embodiment of the present invention provides an IC card, wherein said single printed-circuit board has wiring patterns on said connecting surface and said folding portion includes a slit formed by cutting said single printed-circuit board halfway so that the wiring patterns are intact. The first and second printed-circuit boards are first formed on a single common printed-circuit board. Wiring patterns are formed on one surface of the single printed-circuit board to make the connecting surfaces for the first and second printed-circuit boards. The slit is formed by cutting halfway through the other surface of the single printed-circuit board with the wiring patterns intact. Thus the first and second printed-circuit boards of the board module are electrically connected by the wiring patterns.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENT

The embodiments of the present invention are described with reference to accompanying drawings.
Embodiment 1

Figure 1:
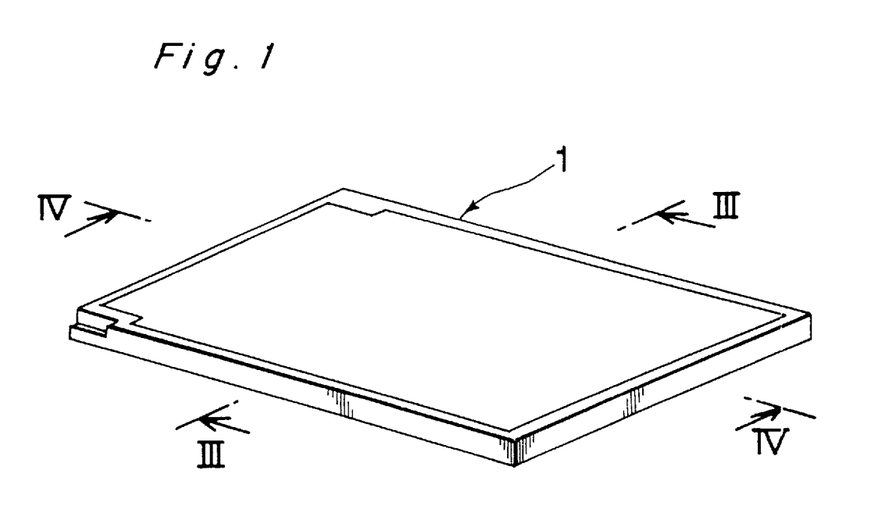
FIG. 1 is a perspective view showing the external appearance of the IC card of Embodiment 1 of the present invention.
Figure 2:
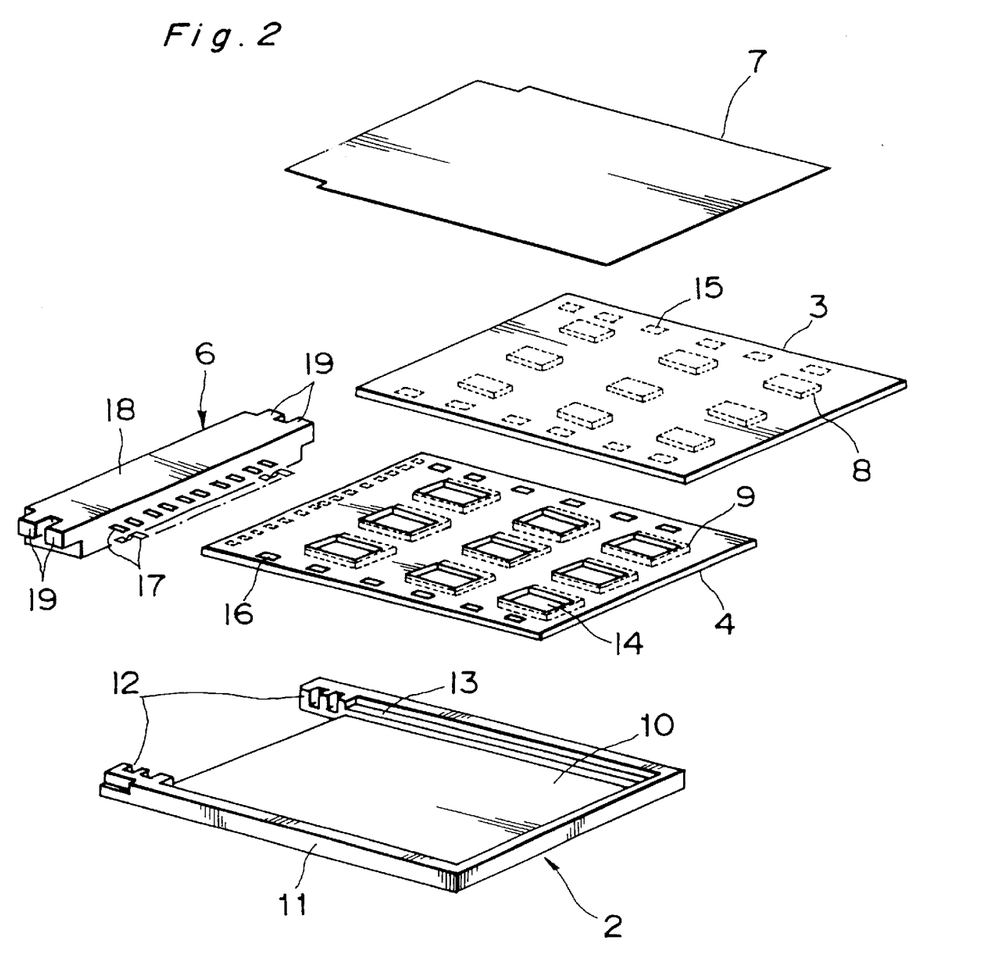
FIG. 2 is an exploded view of the IC card shown in FIG. 1.
Figure 3:
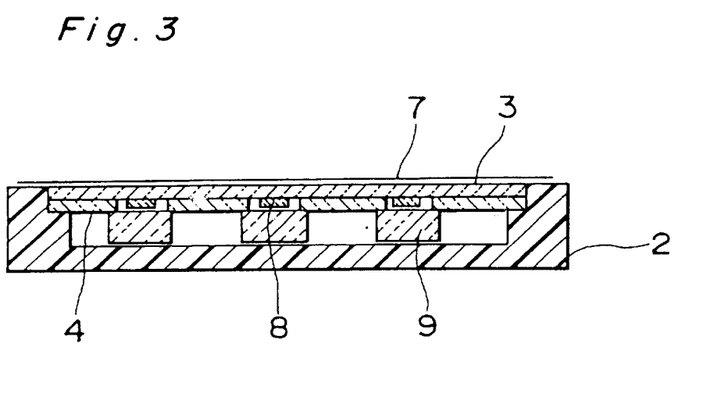
FIG. 3 shows a cross section of the IC card shown in FIG. 1 cut along the plane III—III.
Figure 4:
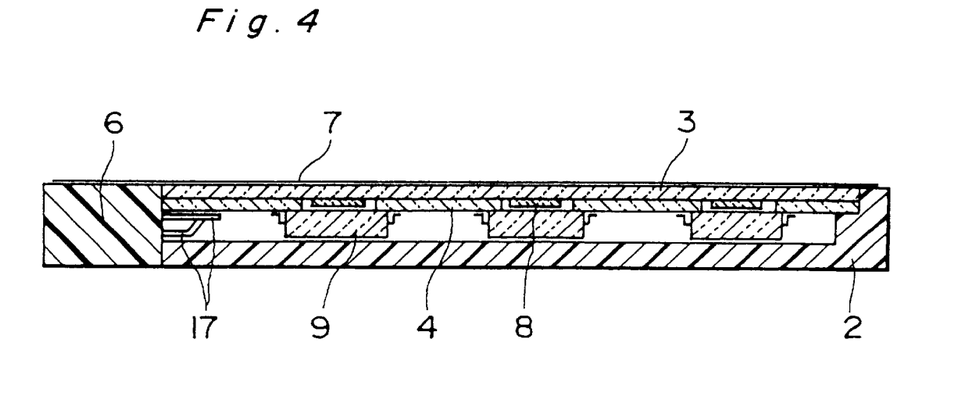
FIG. 4 shows a cross section of the IC card shown in FIG. 1 cut along the plane IV—IV.

FIG. 1 is a perspective view showing an external appearance of the IC card of Embodiment 1 of the present invention. FIG. 2 is an exploded view of the IC card shown in FIG. 1. FIGS. 3 and 4 are cross sections of the IC card shown in FIG. 1 cut along the plane III—III, and the plane IV—IV, respectively.

The IC card 1 shown in FIGS. 1–4 comprises a frame 2 made of a material such as plastic, a first printed-circuit board 3 with various chips, such as bare chips, mounted on one surface of the board, a second printed-circuit board 4 with electronic components, with molded packages, also mounted on one surface of the board, first printed-circuit board 3 and second printed-circuit board 4 forming a board module 5, a connector 6 which is connected with board module 5 and fitted and fixed to frame 2, and a metal panel 7 for sealing board module 5 inside the frame connected with connector 6. Hereinafter a bare chip 8 is taken as an example of the chips mentioned above, and a molded IC 9 is taken as an example of the aforementioned electronic components with the molded packages. First printed-circuit board 3, second printed-circuit board 4, and board module 5 all have dimensions and structures which fit in frame 2.

Frame 2 of the above configuration, as shown in FIG. 2, comprises a substantially rectangular bottom plate portion 10, a U-shaped side wall portion 11 along the edges of bottom plate portion 10, and fitting portions 12 at the ends of the opposite side walls for fitting to connector 6. Typically frame 2 is made of plastic and can be made in one piece. Side wall portion 11 has, on its inner side, a step 13 which holds the edges of board module 5 and secures the module inside frame 2. The inner sides of fitting portions 12 have a teeth-like shape.

Each bare chip 8 is mounted at an appropriate place on one surface of first printed-circuit board 3 by flip chip bonding. Second printed-circuit board 4 has a through hole 14 at a place corresponding to each bare chip 8 so that the bare chips mounted on the first printed-circuit board can go into the holes. Each IC 9 is mounted on a surface (referred to hereinafter as the mounting surface) of second printed-circuit board 4 so that the package of IC 9 covers each through hole 14. The surface of first printed-circuit board 3, on which electronic components are mounted (referred to hereinafter as mounting surface) and the non-mounting surface of second printed-circuit board 4 each have bonding pads on them at corresponding positions.

Next, each bare chip 8 on first printed-circuit board 3 is inserted into corresponding through hole 14 on second printed-circuit board 4, and first printed-circuit board 3 is overlaid on second printed-circuit board 4 so that bonding pads 15 on first printed-circuit board 3 are overlaid on corresponding bonding pads 16 on second printed-circuit board 4. Solder has been placed on either bonding pads 15 or 16. Combining the overlaid first printed-circuit board 3 with second printed-circuit board 4 by means of pressure and heat melts the solder and connects pads 15 and 16 together. Thus first printed-circuit board 3 and second printed-circuit board 4 are bonded together to form board module 5.

Connector 6 comprises a connector housing 18 made of plastic and insert-molded connecting terminals 17, for power supply, ground, signals, and so on, in which pins of an external system are inserted. Board module 5 is connected to connector 6 by soldering connecting terminals 17 to the mounting surface of second printed-circuit board 4. Connector housing 18 includes fitting portions 19 which have shapes corresponding to fitting portions 12 of frame 2. Matching fitting portions 19 with fitting portions 12 fixes connector 6 to frame 2. The height of connector 6 is designed to be the same as the height of side walls 11 of frame 2 so that the combination of the connector and the frame will have a uniform thickness.

It must be noted that second printed-circuit board 4 of board module 5 should face bottom plate portion 10 of frame 2 and sit on step 13. Now, board module 5 is securely contained in frame 2. When connector 6, combined with module 5, is fixed with frame 2, the non-mounting surface of first printed-circuit board 3 of board module 5 is almost coplanar with the top of side wall 11 and the top surface of connector housing 18.

Metal panel 7 comprises a metal foil, one side of which is coated with adhesive. The metal panel is pasted on the non-mounting surface of first printed-circuit board 3, on the top of side wall 11, and on the top surface of connector housing 18, which are almost coplanar, in order to seal off board module 5 from external noise and an electrostatic field. As mentioned earlier, bare chips are inserted into through holes 14.

Figure 5:
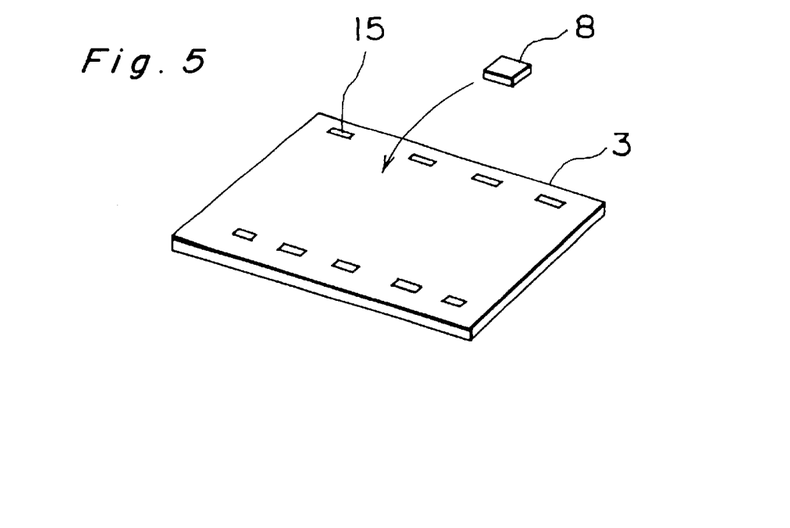
FIG. 5 is a perspective view for showing assembling of electronic chips on first printed-circuit board 3 in FIG. 2.
Figure 6:
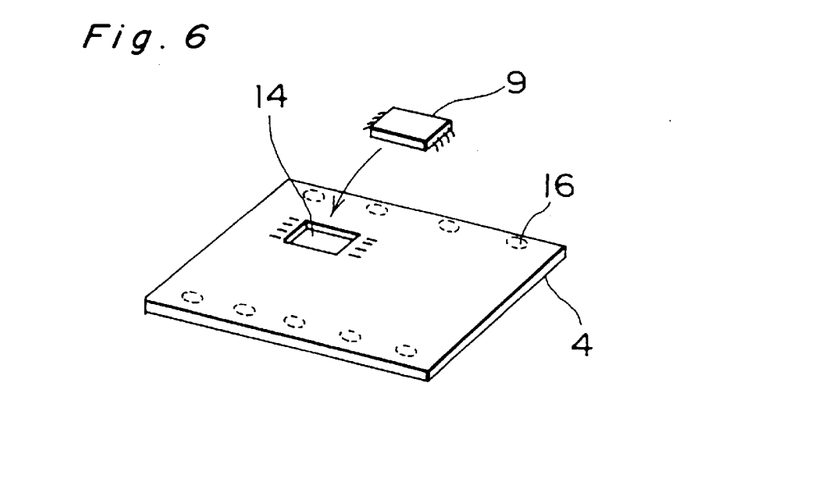
FIG. 6 is a perspective view for showing assembling of electronic chips on second first printed-circuit board 4 in FIG. 2.
Figure 7:
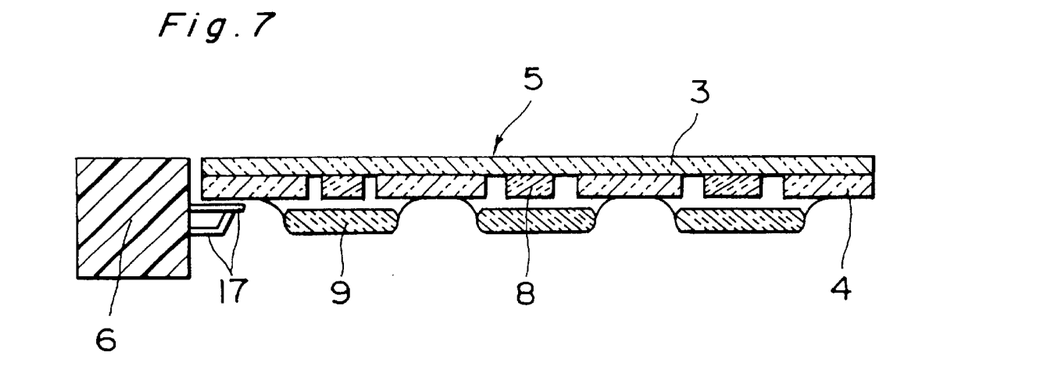
FIG. 7 shows a cross section of combined connector 6 and board module 5 shown in FIG. 2.
Figure 8:
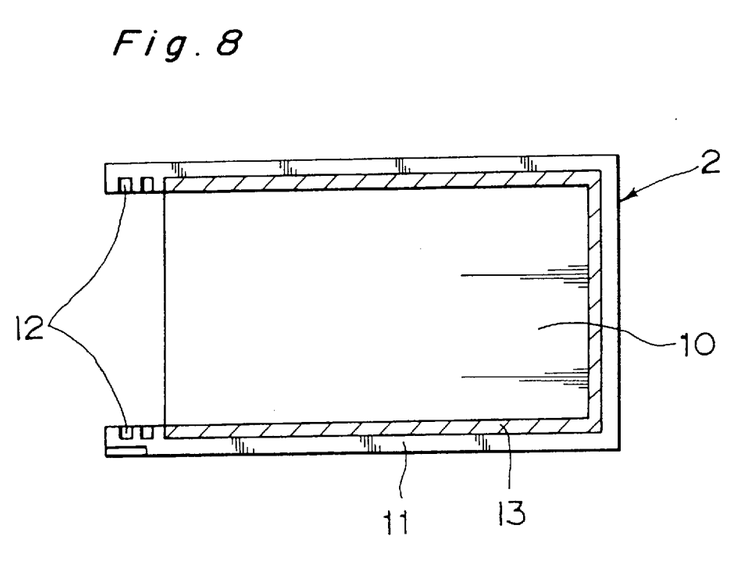
FIG. 8 is a plan view of frame 2 shown in FIG. 2.
Figure 9:
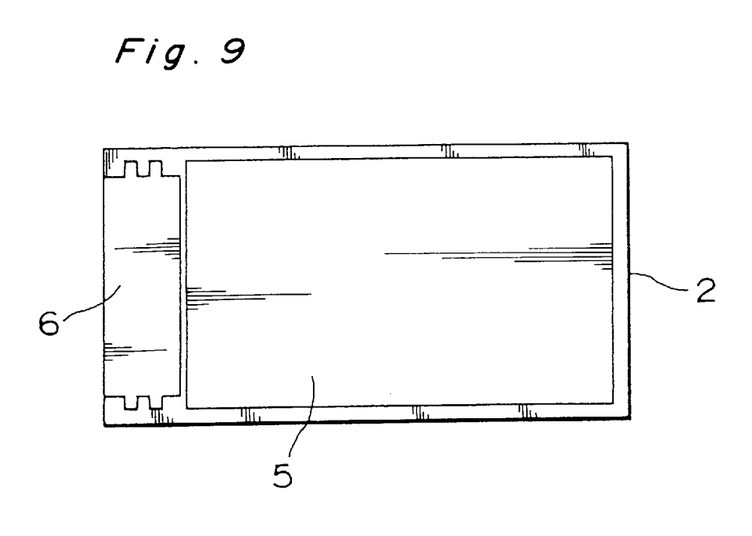
FIG. 9 shows a plan view of connector 6 combined with board module 5 and fixed into frame 2.

FIG. 5 shows how to assemble electronic components on first printed-circuit board 3. FIG. 6 shows how to assemble electronic components on second printed-circuit board 4. FIG. 7 shows a cross section of combined connector 6 and board module 5. FIG. 8 is a plan view of frame 2. FIG. 9 shows a plan view of connector 6 combined with board module 5 and fixed into frame 2. The process for manufacturing IC cards will be described with reference to FIGS. 5–9. In FIG. 6 only one through hole 14 is shown for easy description and understanding, but the printed-circuit board can have more through holes on it depending on the application.

First, as shown in FIG. 5, bonding pads 15 are provided and then bare chips 8 are mounted at appropriate positions on the mounting surface of first printed-circuit board 3. At the same time, as shown in FIG. 6, through holes are formed on second printed-circuit board 4 at positions corresponding to bare chips 8 mounted on first printed-circuit board 3. Bonding pads 16 are also provided on the non-mounting surface of second printed-circuit board 4 at the positions corresponding to bonding pads 15 of first printed-circuit board 3. ICs 9 are then mounted on the mounting surface of second printed-circuit board 4 to cover through holes 14. Solder is placed on either bonding pads 15 or 16.

Next, first printed-circuit board 3 is overlaid on second printed-circuit board 4 so that the mounting surface of first printed-circuit board 3 is in contact with the non-mounting surface of second printed-circuit board 4. In this process each bare chip 8 mounted on first printed-circuit board 3 is inserted into its corresponding through hole 14 of second printed-circuit board 4, and bonding pads 15 are placed on top of bonding pads 16. Pressure and heat are applied to the boards to solder bonding pads 15 to bonding pads 16 in order to form board module 5. Then, inwardly protruded portions of terminals 17 of connector 6 are soldered to the predetermined positions of second printed-circuit board 4.

Next, the edges of the mounting surface of second printed-circuit board 4 are pasted on step 13 of frame 2 in FIG. 8 while fitting portions 19 of connector 6 are fitted into fitting portions 12 of frame 2 to combine connector 6 with frame 2, so that, as shown in FIG. 9, the non-mounting surface of first printed-circuit board 3, the top of side wall 11 of frame 2, and the top surface of connector housing 18 become almost coplanar. To complete an IC card, metal panel 7 is pasted on the non-mounting surface of first printed-circuit board 3, on the top of side wall 11, and on the upper surface of connector housing 18.

Thus, the IC card of Embodiment 1 includes board module 5 formed with first printed-circuit board 3 and second printed-circuit board 4 which are overlaid one on top of the other and combined, in contact with each other, by soldering bonding pads on both boards. In the above process bare chips 8, mounted on first printed-circuit board 3, are inserted into corresponding through holes 14 of second printed-circuit board 4. This structure allows electronic components with a molded package, which are easy to mount, to be used and facilitates the electrical and mechanical connections of two printed-circuit boards. The thickness of board module 5 is about the same as the aforementioned conventional printed-circuit board having electronic components mounted on both sides thereof. Since the mounting surfaces of first and second printed-circuit boards 3 and 4 face in the same direction, no mounting surface of either printed-circuit board is exposed to the outside when board module 5 is fitted into frame 2. Accordingly, the metal plate of the conventional IC card can be replaced by a thin metal foil as in this embodiment.

Since frame 2 with bottom plate 10 can be formed in one piece using resin, only one metal plate is necessary in this embodiment while the conventional IC card requires two metal plates. Further, the IC card of the present embodiment can be assembled from one side while the conventional IC card needs to be assembled from both sides. Thus, the structure of the present embodiment increases the packaging density of electronic components mounted on an IC card, reduces the number of metal panels to be required, permits the use of a less expensive material for the metal panel, facilitates the assembly processes of IC cards, and hence reduces the production cost of IC cards.

Embodiment 2

Figure 10:
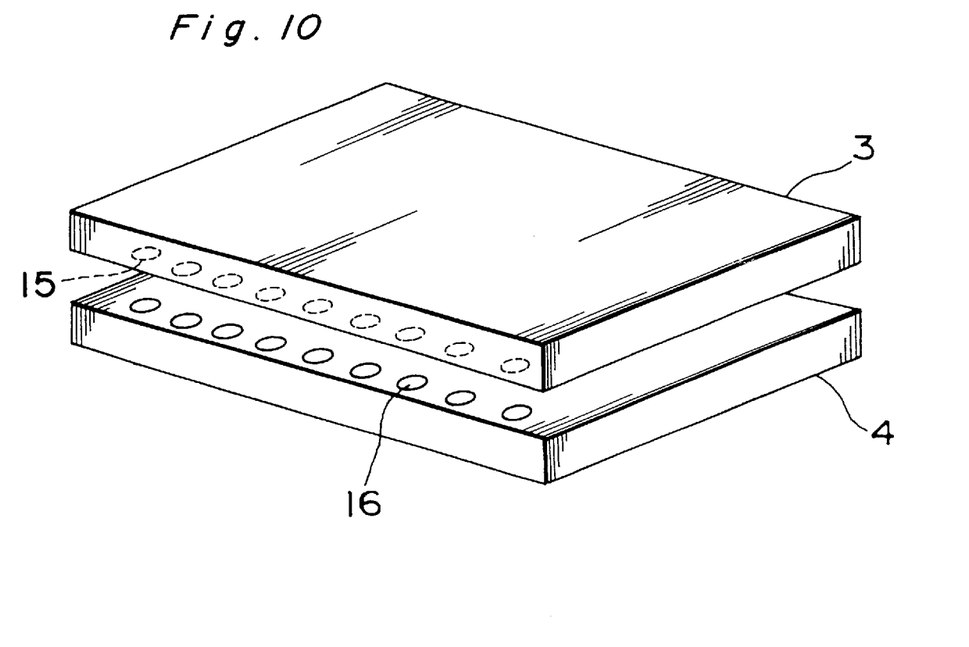
FIG. 10 shows bonding pads 15 and 16 of the IC card of Embodiment 1 of the present invention.
Figure 11:
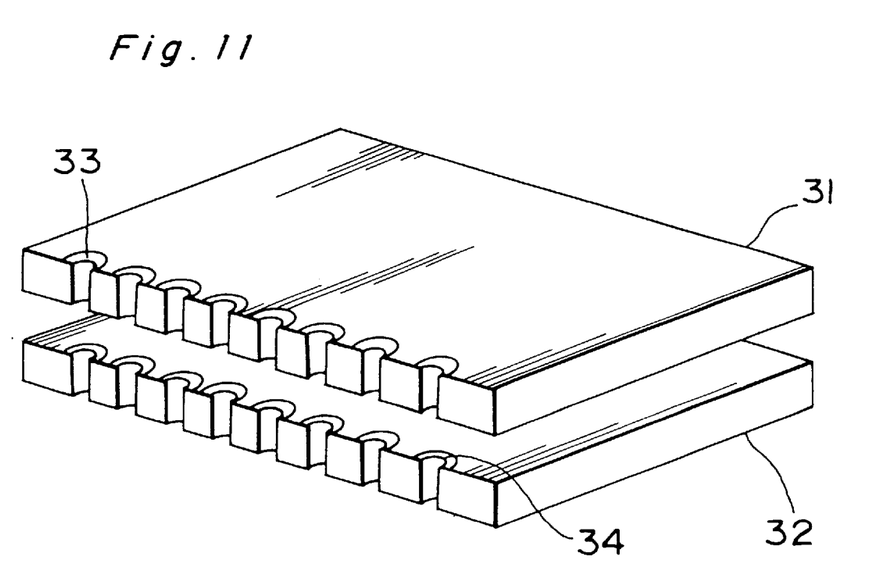
FIG. 11 shows the semicircular through holes of the IC card of Embodiment 2 of the present invention.

FIG. 10 shows bonding pads 15 and 16 for connecting first printed-circuit board 3 to second printed-circuit board 4 of Embodiment 1 as described above. As seen from FIG. 10, it is impossible to check by sight the quality of the soldering after the bonding pads are soldered during the process of Embodiment 1. In order to resolve this problem each of the two printed-circuit boards of the IC card of Embodiment 2 of the present invention includes semicircular through holes along the edge of the board as shown in FIG. 11, by which the two boards are combined. It is noted that the shape of the bonding pads shown in FIG. 10 does not have to be circular, but can be of any shape as far as soldering is done without any problem.

FIG. 11 shows the semicircular through holes used to combine first printed-circuit board 31 with second printed-circuit board 32 of the IC card of Embodiment 2 of the present invention. First printed-circuit board 31 is identical to first printed-circuit board 3 of Embodiment 1 except that semicircular through holes 33 of first printed-circuit board 31 substitute for bonding pads 15 of first printed-circuit board 3. Similarly, second printed-circuit board 32 is identical to second printed-circuit board 4 of Embodiment 1 except that semicircular through holes 34 of second printed-circuit board 32 substitute for bonding pads 16 of second printed-circuit board 4. Since Embodiment 2 is the same as Embodiment 1 except for these differences, only the differences will be described in detail with reference to FIG. 11.

As shown in FIG. 11, one or more semicircular through holes 33 are made along one or more edges of first printed-circuit board 31. Semicircular through holes 34 are made on second printed-circuit board 32 in positions corresponding to semicircular through holes 33 on first printed-circuit board 31. Next, first printed-circuit board 31 is overlaid on second printed-circuit board 32 so that the mounting surface of first printed-circuit board 31 is in contact with the non-mounting surface of second printed-circuit board 32. In this process each bare chip 8 mounted on first printed-circuit board 31 is inserted into its corresponding through hole 14 of second printed-circuit board 32, and semicircular through holes 33 are lined up with corresponding semicircular through holes 34. Semicircular through holes 33 and 34 are soldered by dipping in a solder bath to form a board module.

Thus, the IC card of Embodiment 2 includes a board module formed with first printed-circuit board 31 and second printed-circuit board 32 which are overlaid one on top of the other and combined, in contact with each other, by soldering semicircular through holes 33 and 34. In the above process bare chips 8 mounted on first printed-circuit board 31 are inserted into corresponding through holes 14 of second printed-circuit board 32. In addition to the advantages of the IC cards of Embodiment 1, the structure of Embodiment 2 facilitates the process of the electrical and mechanical connections of first printed-circuit board 31 with second printed-circuit board 32 because the printed-circuit boards are combined with semicircular through holes 33 and 34 dipped in a solder bath. This structure also allows for easier sight inspection of the quality of the soldering. These advantages further reduce the cost of the production of IC cards and improves their reliability.

Embodiment 3

The first and second printed-circuit boards in Embodiments 1 and 2 are prepared separately. However, those boards can be prepared from a single board. The IC card made in this way is referred to as Embodiment 3 of the present invention.

Figure 12:
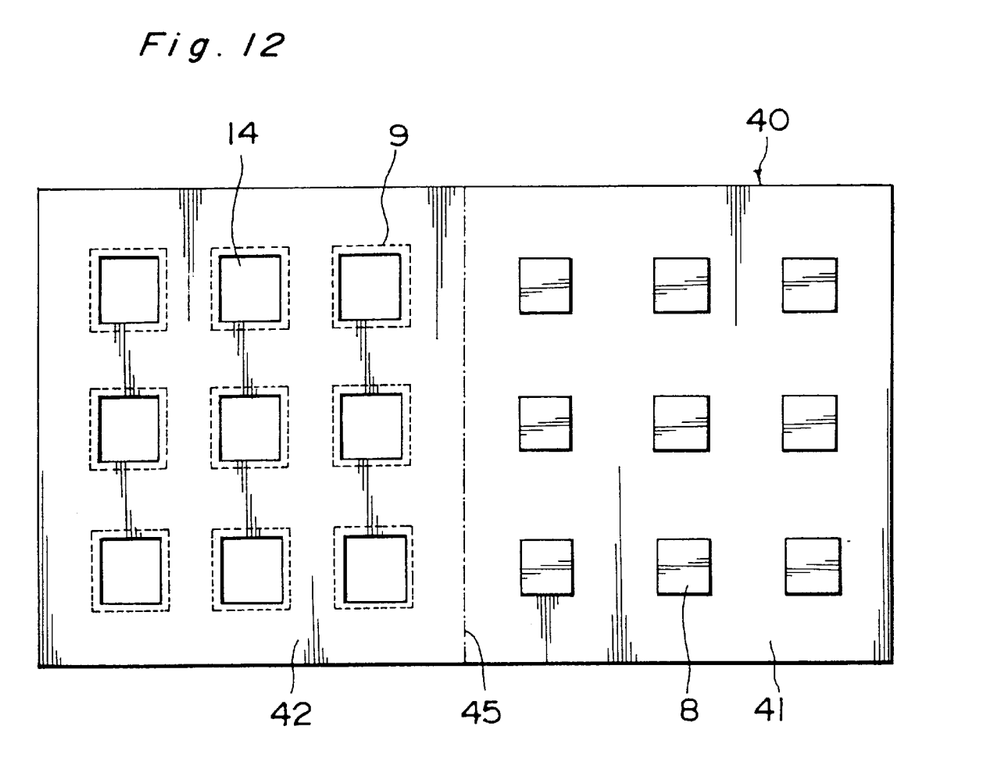
FIG. 12 is a plan view of the printed-circuit boards of the IC card of Embodiment 3 of the present invention.
Figure 13:
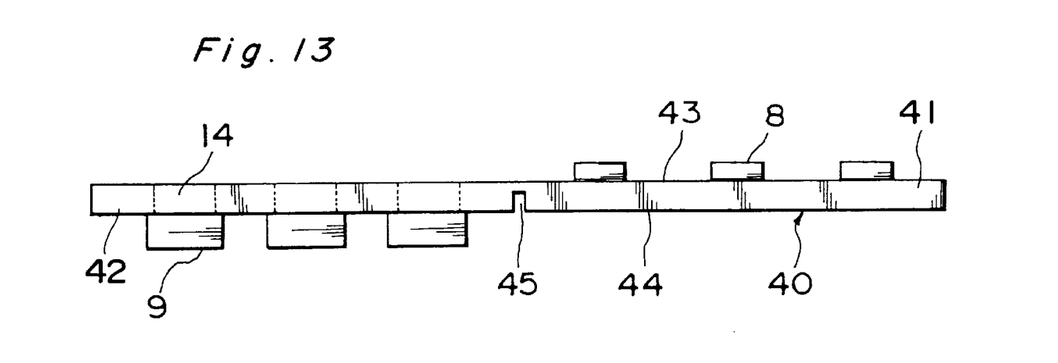
FIG. 13 is a side view of the printed-circuit board shown in FIG. 12.

FIG. 12 is a plan view of the first and second printed-circuit boards prepared on a single printed-circuit board. FIG. 13 is a side view of the printed-circuit board shown in FIG. 12. The IC card of Embodiment 3 is identical to Embodiments 1 and 2 except for the printed-circuit boards. The description of Embodiment 3 of the present invention is given with reference to FIGS. 12 and 13. The like reference numbers in FIGS. 12, 13 and previous drawings indicate the same elements and the description of them will not be given.

In FIGS. 12 and 13, printed-circuit board 40 comprises first printed-circuit board 41 and second printed-circuit board 42. The surface that includes wiring patterns to connect first printed-circuit board 41 with second printed-circuit board 42 electrically is referred to as the connecting surface while the other surface is referred to as the non-connecting surface. Bare chips 8 are mounted at designated positions on connecting surface 43 of first printed-circuit board 41 by flip chip bonding. Second printed-circuit board 42 includes through holes 14 to accommodate bare chips 8 mounted on first printed-circuit board 41 at positions corresponding to those chips. ICs 9 are mounted on non-connecting surface 44 of second printed-circuit board 42 so that the package of each IC covers through holes 14.

At the boundary of first printed-circuit board 41 and printed-circuit board 42 on the non-connecting surface 44 there is a folding slit 45, shallow enough not to break the wiring patterns, for folding the printed-circuit board 40. Printed-circuit board 40 is folded along folding slit 45 and first printed-circuit board 41 is overlaid on second printed-circuit board 42 with bare chips 8, mounted on first printed-circuit board 41, inserted into their corresponding through holes 14 on second printed-circuit board 42.

Adhesive has been applied to all connecting surface 43 of first and second printed-circuit boards 41 and 42 except for the portions where bare chips 8 are mounted. Accordingly, when printed-circuit board 40 is folded, first and second printed-circuit boards 41 and 42 are pasted together with the electronic connection and the wiring intact, and a board module is now formed.

Thus, the IC card of Embodiment 3 includes a board module formed with first printed-circuit board 41 and second printed-circuit board 42. Those printed-circuit boards are first formed on single common printed-circuit board 40 having a slit at the boundary between first printed-circuit board 41 and second printed-circuit board 42; they are then folded along the slit so that connecting surface 43 of first printed-circuit board 41 is in contact with connecting surface 43 of second printed-circuit board 42; and then they are pasted together. In the above process bare chips 8 mounted on first printed-circuit board 41 are inserted into corresponding through holes 14 on second printed-circuit board 42.

In addition to the advantages of the IC cards of Embodiments 1 and 2, the structure of the IC card of the present embodiment has neither bonding pads nor semicircular through holes and allows the first and second printed-circuit boards to be formed from one single printed-circuit board. The structure, therefore, facilitates the design of the printed-circuit boards and reduces the production cost of the printed-circuit boards because folding the printed-circuit board along the slit can easily be done mechanically and because the electrical connection remains intact since the wiring patterns do not break in the folding process.

In Embodiments 1, 2, and 3, first printed-circuit boards 3 and 31, second printed-circuit boards 4 and 32, and printed-circuit board 40 may be formed on a laminated board. In this case printed-circuit board 40 of Embodiment 3 has wiring patterns on the first layer to make an electrical connection between first printed-circuit board 41 and second printed-circuit board 42. Folding slit 45 is formed by cutting the printed-circuit board halfway and leaving the first layer intact.

While, in addition to the above embodiments, there are various modifications of the present invention, it should be understood that the above embodiments have been presented by way of examples only and not limitation. Thus, the breadth and scope of the present invention should be defined only in accordance with the claims described in Scope of claims.

Although the present invention has been fully described in connection with the preferred embodiments thereof with reference to the accompanying drawings, it is to be noted that various and modifications are apparent to those skilled in the art. Such changes and modifications are to be understood as included within the scope of the present invention as defined by the appended claims unless they depart therefrom.

What is claimed is:

1. An IC card, comprising:

a frame including a rectangular bottom plate and a U-shaped side wall along the three edges of said bottom plate;

a connector fixed to the open side of said frame with the U-shaped side wall;

a board module including a first printed-circuit board with electronic components mounted thereon and a second printed-circuit board with electronic components mounted only on one surface thereof, said second printed-circuit board being overlaid on top of said first printed-circuit board so that the mounting surfaces of the electronic components face in the same direction said board module combined with said connector and inserted in said frame; and a metal panel for sealing board module inside said frame with said connector fixed thereto, said metal panel facing a surface of said second printed-circuit board with no electric components mounted thereon.

2. An IC card of claim 1, wherein said metal panel is formed of a metal foil.

3. An IC card of claim 1, wherein said second printed-circuit board includes through holes where the electronic components mounted on said first printed-circuit board are inserted so that when said first printed-circuit board is overlaid on said second printed-circuit board and brought into contact therewith, the electronic components mounted on said first printed-circuit board do not come into contact with the non-mounting surface of said second printed-circuit board.

4. An IC card of claim 3, wherein said first and second printed-circuit boards include bonding pads on the facing surfaces thereof at opposite positions so that said first and second printed-circuit boards can be connected by soldering the bonding pads.

5. An IC card of claim 3, wherein said first and second printed-circuit boards include semicircular through holes at opposite positions along the side of said board module, so that said first and second printed-circuit boards can be connected by soldering each pair of corresponding semicircular through holes.

6. An IC card of claim 1, wherein said first and second printed-circuit boards are formed of a single printed-circuit board, one surface of which forms connecting surfaces for said first and second printed-circuit boards, and the other surface of which includes a folding portion with a slit along the boundary of said first and second printed-circuit boards, said board module being formed by folding said single printed-circuit board along said folding portion so that the connecting surfaces of said first and second printed-circuit boards are in contact with each other.

7. An IC card of claim 6, wherein said single printed-circuit board has wiring patterns on said connecting surface and said folding portion includes a slit formed by cutting said single printed-circuit board halfway so that wiring patterns are intact.

8. An IC card of claim 1, wherein said first printed-circuit board is independent from said second printed-circuit.

9. An IC card of claim 1, wherein said first printed-circuit board and said second printed-circuit board are electrically connected.

* * * * *